US009882345B2

(12) United States Patent
Hiraga

(10) Patent No.: US 9,882,345 B2
(45) Date of Patent: Jan. 30, 2018

(54) LASER LIGHT SOURCE, PROJECTOR PROVIDED WITH LASER LIGHT SOURCE, AND METHOD FOR MANUFACTURING LASER LIGHT SOURCE

(71) Applicant: NEC Display Solutions, Ltd., Tokyo (JP)

(72) Inventor: Takashi Hiraga, Tokyo (JP)

(73) Assignee: NEC Display Solutions, Ltd., Tokyo (JP)

( * ) Notice: Subject to any disclaimer, the term of this patent is extended or adjusted under 35 U.S.C. 154(b) by 0 days.

(21) Appl. No.: 15/120,098

(22) PCT Filed: Apr. 24, 2014

(86) PCT No.: PCT/JP2014/061619
§ 371 (c)(1),
(2) Date: Aug. 18, 2016

(87) PCT Pub. No.: WO2015/162767
PCT Pub. Date: Oct. 29, 2015

(65) Prior Publication Data
US 2017/0125971 A1    May 4, 2017

(51) Int. Cl.
*H01S 5/022*    (2006.01)
*G03B 21/20*    (2006.01)
(Continued)

(52) U.S. Cl.
CPC .......... *H01S 5/022* (2013.01); *G03B 21/2033* (2013.01); *G03B 21/2073* (2013.01);
(Continued)

(58) Field of Classification Search
CPC ............ G03B 21/2033; G03B 21/2053; G03B 21/2073; F21K 9/00; F21K 9/56; H01L 31/105; H01L 31/035281
See application file for complete search history.

(56) References Cited

U.S. PATENT DOCUMENTS 6,002,705 A    12/1999 Thornton
2003/0128726 A1*  7/2003 Tatsuno ................. G11B 7/127
                                                    372/36
(Continued)

FOREIGN PATENT DOCUMENTS

JP    H07-022706 A    1/1995
JP    H08-181391 A    7/1996
(Continued)

OTHER PUBLICATIONS

International Search Report in PCT/JP2014/061619 dated Jan. 27, 2015 (English Translation Thereof).

*Primary Examiner* — Sultan Chowdhury
(74) *Attorney, Agent, or Firm* — McGinn IP Law Group, PLLC

(57) ABSTRACT

The present invention realizes both a laser light source that, despite the use of a plurality of laser diodes and transmission through a modulator that allows transmission of a specific orientation of linearly polarized light, is free from the occurrence of uneven luminance or uneven color, and a projector device that uses this laser light source. The laser light source is provided with a plurality of laser diodes that are mounted on a substrate and that emit linearly polarized light in the same direction. The plurality of laser diodes are arranged such that the orientation of the emitted linearly polarized light is different for each laser diode.

20 Claims, 7 Drawing Sheets

(51) Int. Cl.
*H01S 5/40* (2006.01)
*H04N 9/31* (2006.01)
*H04N 13/04* (2006.01)

(52) U.S. Cl.
CPC ......... *H01S 5/4025* (2013.01); *H04N 9/3158* (2013.01); *H04N 9/3161* (2013.01); *H04N 9/3167* (2013.01); *H04N 13/0434* (2013.01); *H04N 13/0459* (2013.01); *H01S 5/4018* (2013.01)

(56) References Cited

U.S. PATENT DOCUMENTS

| | | | | |
|---|---|---|---|---|
| 2004/0109484 A1* | 6/2004 | Shinohara | ............ | G11B 7/1353 372/50.11 |
| 2007/0085978 A1* | 4/2007 | Yamauchi | .............. | G03B 21/26 353/94 |
| 2010/0231862 A1* | 9/2010 | Itoh | .................... | G02B 27/0994 353/31 |
| 2013/0321777 A1* | 12/2013 | Wang | ...................... | F21V 13/08 353/31 |
| 2014/0126200 A1* | 5/2014 | Kelchner | .................. | F21K 9/56 362/231 |

FOREIGN PATENT DOCUMENTS

| | | |
|---|---|---|
| JP | 2007-250168 A | 9/2007 |
| JP | 2008-060433 A | 3/2008 |
| JP | 2009-151221 A | 7/2009 |
| JP | 2011-146498 A | 7/2011 |
| JP | 2012-088451 A | 5/2012 |
| JP | 2013-008950 A | 1/2013 |
| WO | WO 2014/038434 A1 | 3/2014 |

\* cited by examiner

LASER LIGHT SOURCE, PROJECTOR PROVIDED WITH LASER LIGHT SOURCE, AND METHOD FOR MANUFACTURING LASER LIGHT SOURCE

TECHNICAL FIELD

The present invention relates to a laser light source that uses laser diodes that supply linearly polarized light, a projector that is provided with the laser light source, and a method for manufacturing the laser light source.

BACKGROUND ART

A lighting device that uses a laser as a light source is disclosed in Patent Document 1 (Japanese Unexamined Patent Application Publication No. 2012-088451). This lighting device was realized with a view to resolving the problem of how to effectively reduce uneven luminance of illumination light while achieving miniaturization and improving the utilization efficiency of light and is provided with: a light source unit that has a plurality of types of laser elements that emit light of different wavelengths; a parallelizing optical system that emits each incident light beam from the plurality of types of laser elements as separate parallel light beams; an optical path synthesizing optical system that carries out optical path synthesis for each parallel light beam that is emitted from the parallelizing optical system; a magnifying optical system that magnifies the beam diameter of each parallel light beam that follows optical path synthesis and emits the resulting light beam; and a uniformizing optical system that uniformizes the in-plane intensity distribution of each parallel light beam that is emitted from the magnifying optical system.

The above-described lighting device is used in a display apparatus such as a projector that displays images. One form of projector performs 3D display. In addition to the typical constituent elements of a projector such as a light source, an image-forming unit that uses the light from the light source to form image light, and a projection optical system that projects the image light that was formed in the image-forming unit, a projector that performs 3D display is further provided with a modulator that modulates the image light that is to be projected to right-eye display image light and left-eye display image light.

The image-forming unit generates an image by switching the right-eye image light and left-eye image light in a time series. The modulator is a component that is configured to enable control of the orientation of the linearly polarized light that is transmitted, and when transmitting right-eye image light and left-eye image light, transmits linearly polarized light having a mutually different orientation, whereby the right-eye projected image light and left-eye projected image light that are the mutually different linearly polarized light are projected in order.

Laser diodes are used as a plurality of laser elements to form the laser light source, and when used in a projector device that performs 3D display as described above, the fact that the laser light is linearly polarized light results in a potential that, when the light is projected through a modulator and projected at the time of 3D display, color uniformity and luminance uniformity will be degraded, leading to the occurrence of uneven color and uneven luminance on the screen. The operation of the modulator that switches the linearly polarized light that is transmitted is next described with reference to drawings.

As shown in FIG. 1, when absorption axis $1b$ of modulator $1a$ and the orientation of linearly polarized light $1c$ that is irradiated into modulator $1a$ differ by 90 degrees, linearly polarized light $1c$ is transmitted through modulator $1a$.

As shown in FIG. 2, when absorption axis $1b$ of modulator $1a$ and the orientation of linearly polarized light $2c$ that is irradiated into modulator $1a$ are the same, linearly polarized light $2c$ is not transmitted through modulator $1a$.

As shown in FIG. 3, when absorption axis $1b$ of modulator $1a$ and the orientation of linearly polarized light $3c$ that is irradiated into modulator $1a$ differ by 45 degrees, linearly polarized light $3c$ is attenuated and transmitted.

When linearly polarized light is transmitted through glass such as a lens that makes up the projection optical system of a projector, disruption of the orientation of the linearly polarized light may occur. This disruption differs according to the point of transmission through the lens (glass), and consequently, the use of a plurality of laser diodes results in the occurrence of a nonuniform state of disruption that differs for each of the laser diodes. As a result, uneven color and uneven luminance occur in the image that is projected through the modulator.

As shown in FIG. 4, when the plurality of laser diodes are arranged such that the orientation of linearly polarized light that is emitted is the same, the orientation of the linear polarized light of the synthesized light of the light from each of the laser diodes is uniform. Subsequent transmission through glass causes the orientation of the linear direction to vary according to the site of the image, as shown in FIG. 5.

When light of the state shown in FIG. 5 passes through a modulator, the quantity of light that is transmitted changes according to the site of the image and uneven color and uneven luminance occur. FIG. 6 shows an example of uneven luminance. Even in a case of using an image signal for display of a screen having uniform luminance, the luminance of site Ea on the projection screen is higher than the luminance of site Eb and uneven luminance occurs.

The symptom of uneven color is described taking as an example a projector that uses as light sources blue laser light as a blue light source and red and green light that are obtained by irradiating the blue laser light as an excitation light upon a fluorescent material that emits yellow fluorescent light and then separating the yellow fluorescent light that is generated.

The yellow fluorescent light and the red and green light that are obtained from this light are not linearly polarized light, and only the blue light that is laser light is linearly polarized light.

When a plurality of laser diodes that emit blue laser light are arranged such that the orientation of the linearly polarized light that is emitted is the same as shown in FIG. 4 and then caused to pass through a modulator, the luminance of site Ea is higher than the luminance of site Eb for the blue light, as shown in FIG. 6. On the other hand, the red light and green light are not linearly polarized light, and the luminance is therefore uniform within the screen. As a result, even when using a picture signal that displays a picture of uniform color on the entire screen, the color of site Ea will differ from that of site Eb, and uneven color will occur.

When carrying out 3D display, when the modulator transmits right-eye image light and left-eye image light, the orientation of the linearly polarized light that is transmitted is assumed to differ, and when a plurality of laser diodes are used as the light source and the orientation of the linearly polarized light of each laser diode is made uniform, the above-described uneven luminance or uneven color will occur.

Patent Document 2 (Japanese Unexamined Patent Application Publication No. H07-22706) discloses a configuration in which the polarization direction of half of the plurality of laser diodes is made different from the polarization direction of the other half. Cited document 2 describes the ability to readily provide stereoscopic display through the use of polarizing means, i.e., polarizing glasses in which, for example, polarizing plates that transmit light that is parallel to each of the polarized waves are arranged on the right and left, and in the case of such a construction, the polarizing means acts as a modulator and therefore results in the occurrence of uneven luminance or uneven color.

LITERATURE OF THE PRIOR ART

Patent Documents

Patent Document 1: Japanese Unexamined Patent Application Publication No. 2012-088451
Patent Document 2: Japanese Unexamined Patent Application Publication No. H07-022706

SUMMARY OF THE INVENTION

Problem to be Solved by the Invention

When a plurality of laser diodes are arranged such that the orientation of linearly polarized light is the same and the light is then passed through a modulator, uneven luminance occurs. Further, if the linearly polarized light realized by these laser diodes is synthesized with light of another color that is not linearly polarized light and then passed through a modulator, uneven color occurs.

The above-described uneven luminance and uneven color similarly occur even in the construction described in the above-described Patent Document 2.

The present invention realizes a laser light source, a projector device that uses this laser light source, and a method of manufacturing the laser light source in which uneven luminance and uneven color do not occur despite the use of a plurality of laser diodes and the transmission of linearly polarized light of a particular orientation through a modulator.

Means for Solving the Problem

The laser light source of the present invention is provided with a plurality of laser diodes that are mounted on a substrate and that emit linearly polarized light;
wherein the plurality of laser diodes are arranged such that the orientation of linearly polarized light that is emitted differs for each laser diode.
The projector of the present invention includes:
a light source device that is realized using the above-described laser light source and that supplies light that contains the emitted light of the plurality of laser diodes;
an image-forming unit that uses the light from the light source device to form image light; and a projection optical system that projects the image light formed in the image-forming unit.
The laser light source manufacturing method of the present invention includes arranging a plurality of laser diodes that emit linearly polarized light on a substrate such that the orientation of the emitted linearly polarized light differs for each.

Effect of the Invention

The present invention, by arranging each of the polarized light sources in a projector device that has a plurality of polarized light sources by rotating each to a different angle and thus varying the angles of polarization and dispersing the polarization components of the synthesized light, obtains an improvement of color uniformity and luminance uniformity on the screen when the light is projected through a modulator that switches polarization in 3D display.

BEST MODE FOR CARRYING OUT THE INVENTION

Exemplary embodiments of the present invention are next described with reference to the accompanying drawings.

First Exemplary Embodiment

Figure 1:
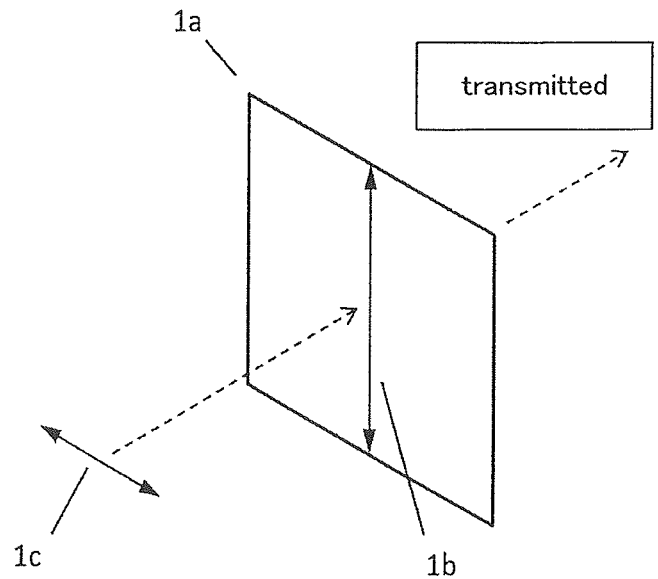
FIG. 1 shows the operation of a modulator.
Figure 2:
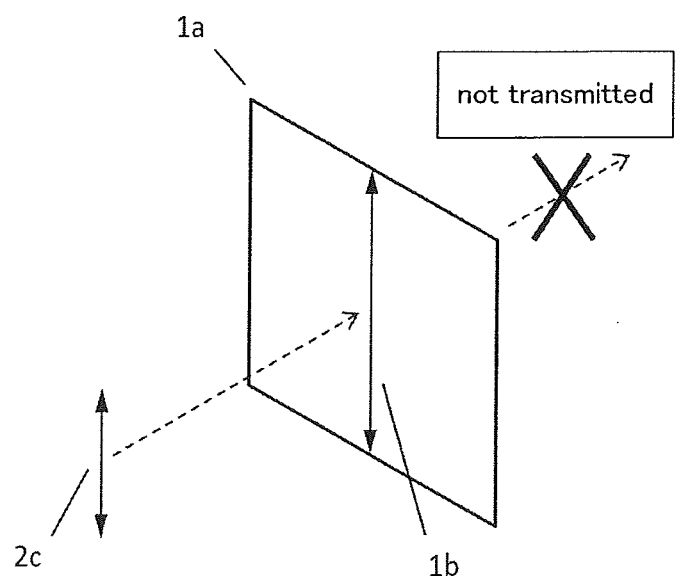
FIG. 2 shows the operation of a modulator.
Figure 3:
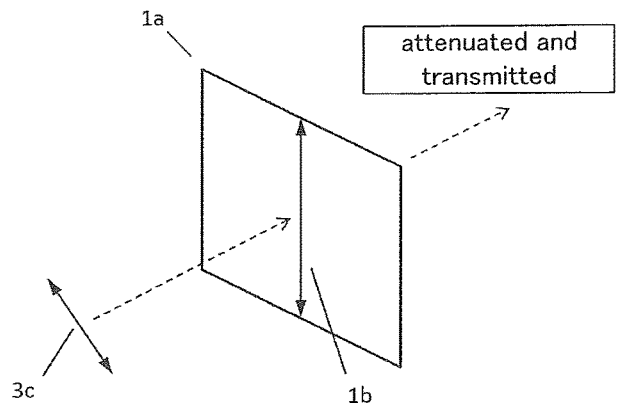
FIG. 3 shows the operation of a modulator.
Figure 4:
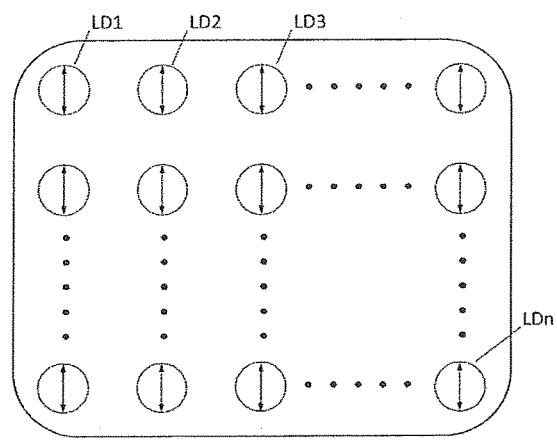
FIG. 4 shows a plurality of laser diodes that are arranged such that the orientation of emitted linearly polarized light is the same.
Figure 5:
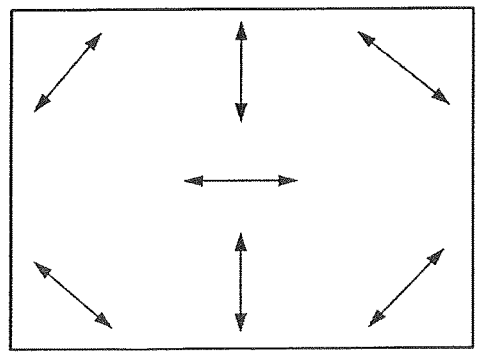
FIG. 5 shows the state in which the orientation of the linear direction of the plurality of laser diodes shown in FIG. 4 varies.
Figure 6:
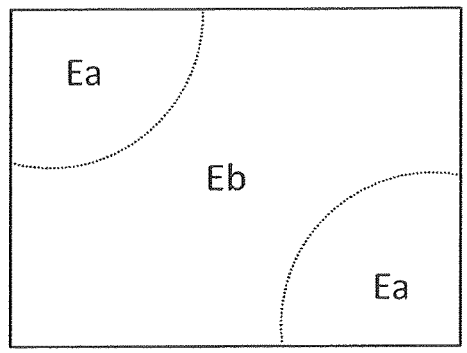
FIG. 6 shows an example of uneven luminance.
Figure 7:
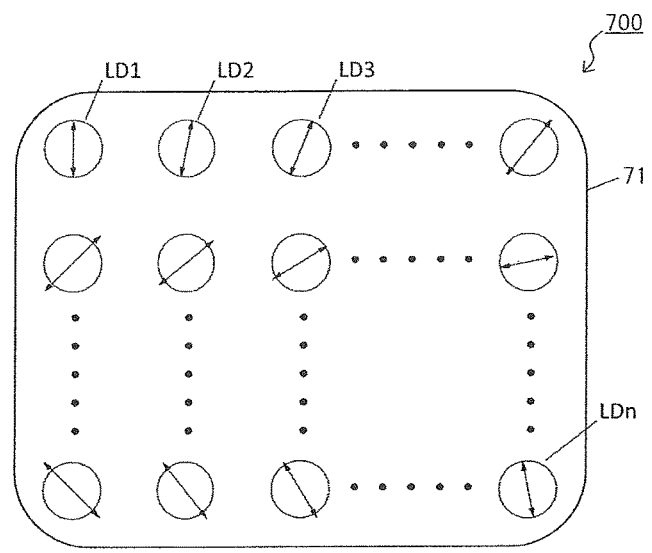
FIG. 7 is a plan view showing the principal constituent elements of the first exemplary embodiment of a laser light source according to the present invention.

FIG. 7 is a plan view showing the principal constituent elements of the first exemplary embodiment of the laser light source according to the present invention.

A number n of laser diodes LD1, LD2, LD3, . . . LDn that emit light of the same wavelength (for example, blue light) are arranged in a matrix on substrate 71 that forms laser light source 700. Each laser diode is arranged such that the orientation of linearly polarized light of the emitted laser light differs for each laser diode.

If the orientation of linearly polarized light of laser diode LD1 in FIG. 7 is assumed to be 0 degrees, the orientation of linearly polarized light of laser diode LD21 is assumed to be rotated 180×1/n degrees, the orientation of linearly polarized light of laser diode LD3 is assumed to be rotated 180×2/n degrees, and the orientation of linearly polarized light of laser diode LDn1 is assumed to be rotated 180×(n−1)/n degrees, the orientations of linearly polarized light thus being disposed such that each is a different angle.

Figure 15:
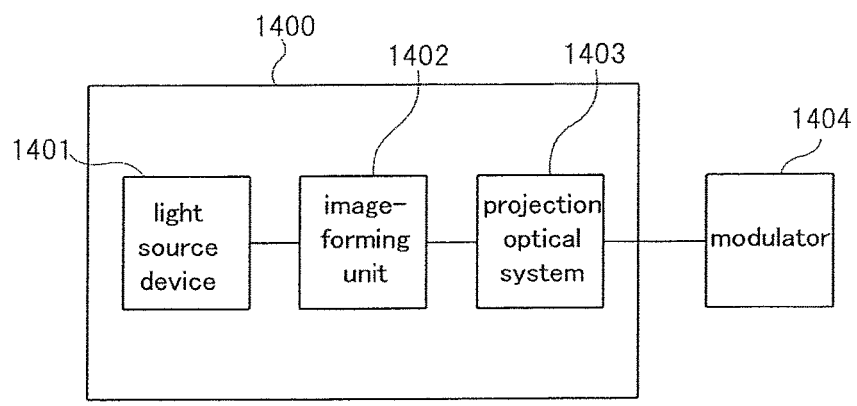
FIG. 15 is a block diagram showing the configuration of an exemplary embodiment of the projector according to the present invention.

FIG. 15 is a block diagram showing the configuration of an exemplary embodiment of the projector according to the present invention.

Projector 1400 is provided with light source device 1401, image-forming unit 1402, and projection optical system 1403. In addition, removable modulator 1404 is provided on the side of projector 1400 from which the projected light is supplied.

Light source device 1401 incorporates laser light source 700 shown in FIG. 7 and supplies the emitted light of laser light source 700 and other illumination light. As the other illumination light, output light of a light source that is provided apart from laser light source 700 may be used, or the emitted light of laser light source 700 may be taken as the excitation light of a fluorescent material and the emitted fluorescent light or light obtained by color-separating the emitted fluorescent light may be used as the other illumination light.

Image forming unit 1402 is a component that uses light from light source device 1401 to form image light, and more specifically, is made up of, for example, a DMD (Digital Micromirror Device) reflective liquid crystal display element or a transmissive liquid crystal display element. Projection optical system 1403 is an optical system that enlarges and projects the image light that was formed by image-forming unit 1402.

Modulator 1404 is installed when the 3D display system is implemented. When the 3D display system is implemented, image-forming unit 1402 switches and generates right-eye image light and left-eye image light in a time series. Modulator 1404 is configured to be capable of controlling the orientation of linearly polarized light that is transmitted and thus transmits linearly polarized light of respectively different orientation when transmitting right-eye image light and left-eye image light.

Figure 8:
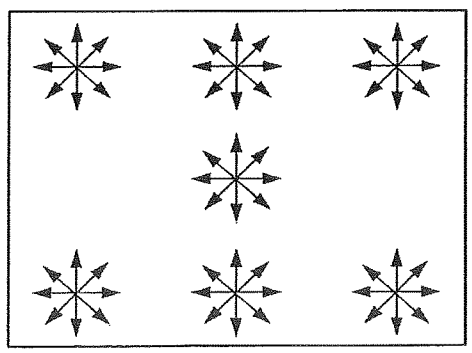
FIG. 8 shows the state in which the orientation of linearly polarized light is dispersed.

In the synthesized light of the emitted light of each of the laser diodes arranged as shown in FIG. 7, the orientation of the linearly polarized light is dispersed as shown in FIG. 8, following which the orientation of the linearly polarized light is further dispersed when being transmitted through the glass of, for example, the lens that makes up projection optical system 1403. As a result, at the time of 3D display, the light that is transmitted through modulator 1404 is uniform regardless of the site on the projection surface, and the occurrence of uneven color and uneven luminance on the projection surface is prevented, thus achieving excellent color uniformity and luminance uniformity.

Second Exemplary Embodiment

Figure 9:
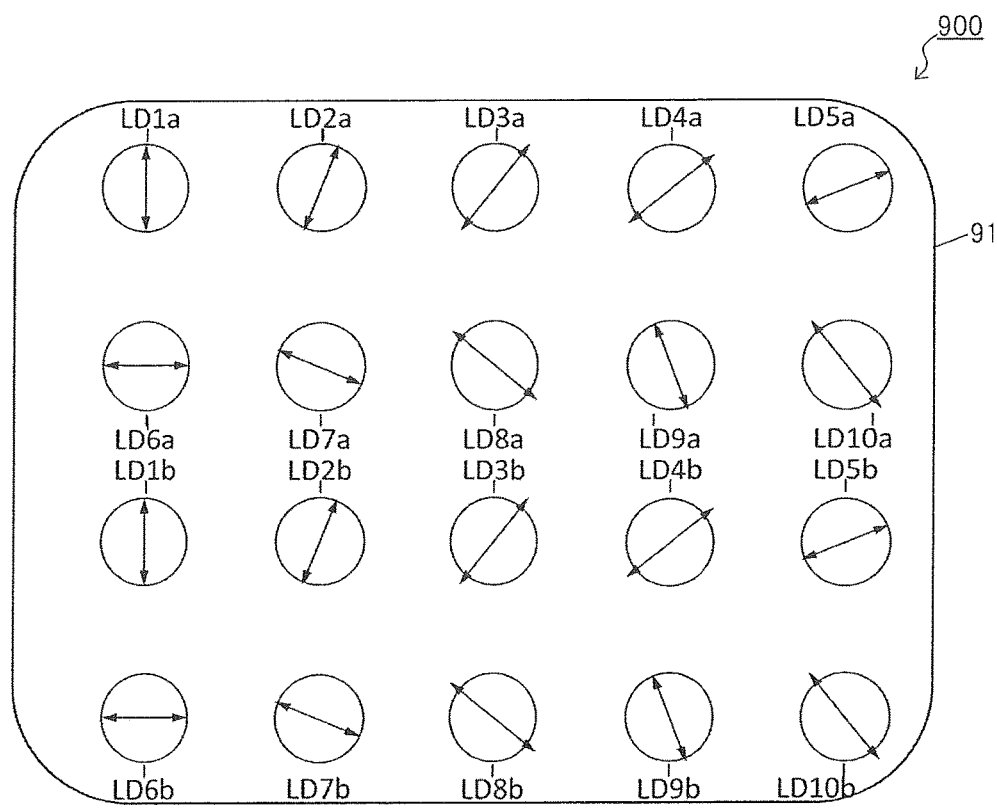
FIG. 9 is a plan view showing the principal constituent elements of the second exemplary embodiment of the laser light source according to the present invention.

FIG. 9 is a plan view showing the principal constituent elements of the second exemplary embodiment of the laser light source according to the present invention.

Ten laser diodes LD1a-LD10a and ten laser diodes LD1b-LD10b are arranged in matrix form on support part 91 that makes up laser light source 900.

Figure 10:
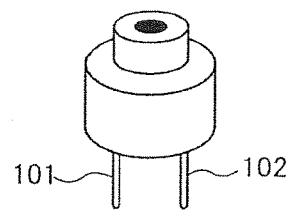
FIG. 10 shows an outer view of a laser diode.

FIG. 10 shows the outer appearance of laser diodes LD1a-LD10a and LD1b-LD10b. Laser diodes LD1a-LD10a and LD1b-LD10b are each provided with pin 101 that connects to an anode and pin 102 that connects to a cathode and emit linearly polarized light of an orientation that accords with the lines that connect pin 101 and pin 102.

As shown in FIG. 10, laser diodes LD1a-LD10a and LD1b-LD10b have the same shape, and laser diodes LD1a-LD10a and LD1b-LD10b supply light of a first wavelength (for example, blue light).

Each of laser diodes LD1a-LD10a is disposed such that the orientation of the linearly polarized light of the laser light emitted by each differs from the others, and similarly, each of laser diodes LD1b-LD10b is disposed such that the orientation of the linearly polarized light of the laser light emitted by each differs from the others.

If the orientation of the linearly polarized light that is supplied by laser diode LD1a is assumed to be 0 degrees, the orientation of the linearly polarized light of laser diode LD2a is assumed to be rotated by 180×1/10=18 degrees, the orientation of the linearly polarized light of laser diode LD3a is assumed to be rotated by 180×2/10=36 degrees, and the orientation of the linearly polarized light of laser diode LD10a is assumed to be rotated by 180×9/10=162 degrees, the orientations being disposed to successively rotate at an angle of 18 degrees. Similarly, if the orientation of the linearly polarized light of laser diode LD1b is assumed to be 0 degrees, the orientation of the linearly polarized light of laser diode LD2b is assumed to be rotated by 180×1/10=18 degrees, the orientation of the linearly polarized light of laser diode LD3b is assumed to be rotated by 180×2/10=36 degrees, and the orientation of the linearly polarized light of laser diode LD10b is assumed to be rotated by 180×9/10=162 degrees, the orientations being disposed to successively rotate by an angle of 18 degrees.

Figure 11:
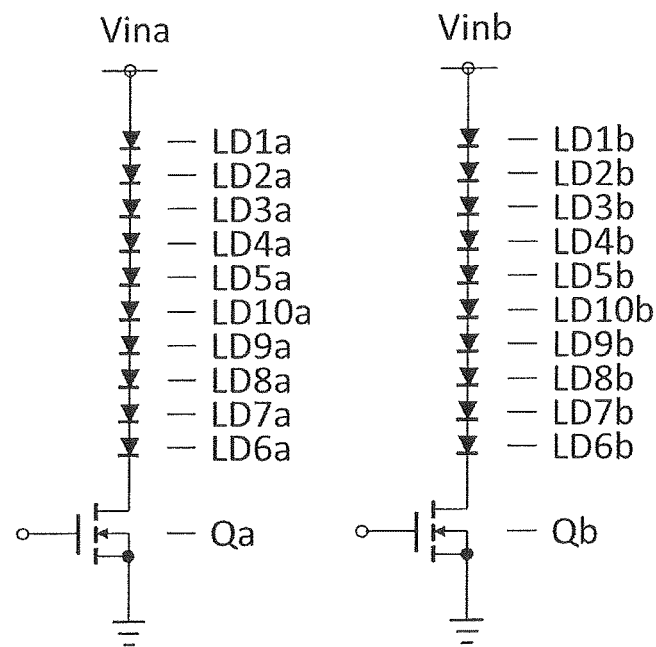
FIG. 11 is a circuit diagram of a circuit that drives laser diodes.
Figure 12:
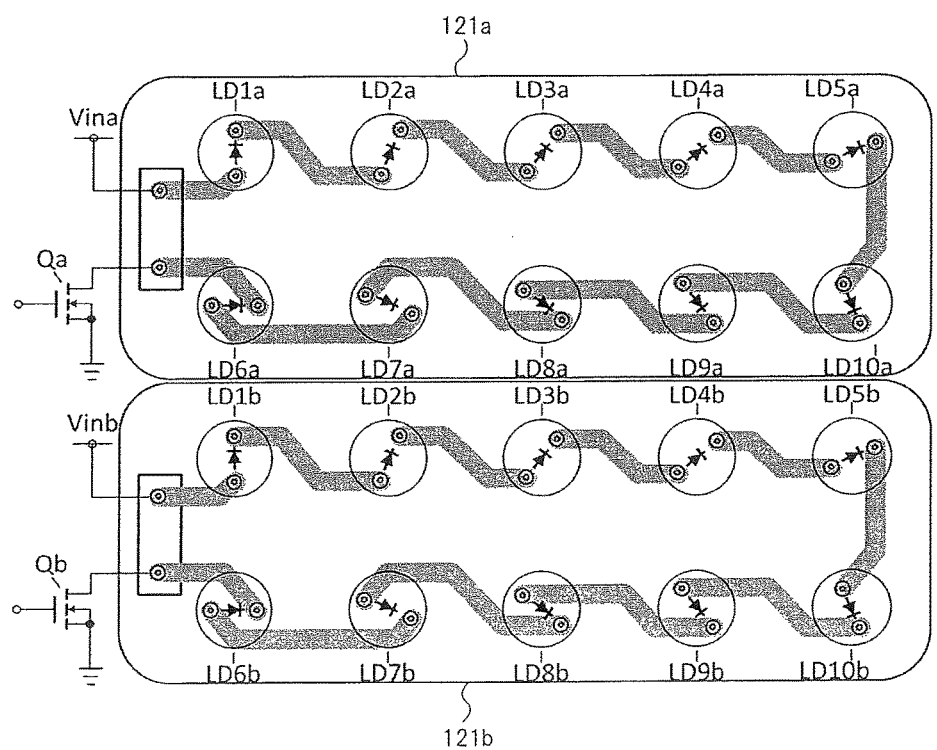
FIG. 12 shows the circuit pattern that is used in the second exemplary embodiment that realizes the circuit diagram shown in FIG. 11.

FIG. 11 is a circuit diagram of the circuit that drives laser diodes LD1a-LD10a and laser diodes LD1b-LD10b, and FIG. 12 shows the circuit pattern that is used in the present exemplary embodiment to realize the circuit diagram shown in FIG. 11.

Laser diodes LD1a-LD10a are connected in a series, drive voltage Vina is applied to the anode, and the emission state of the laser light is controlled according to the ON/OFF state of switching transistor Qa that is connected to the anode. Laser diodes LD1b-LD10b are connected in a series, drive voltage Vinb is applied to the anode, and the emission state of the laser light is controlled according to the ON/OFF state of switching transistor Qb that is connected to the anode. In this way, two sets of constant-current circuits are used in the present exemplary embodiment.

Substrates 121a and 121b that are shown in FIG. 12 are realized by printed wiring boards or flexible boards. Substrate 121a and substrate 121b are mounted on support part 91, and laser diodes LD1a-LD10a and laser diodes LD1b-LD10b are packaged. For substrate 121a, laser diodes LD1a-LD10a are connected and wired in a series as in the circuit diagram shown in FIG. 11 with, for example, the cathode terminal of laser diode LD1a connected to the anode terminal of laser diode LD2a, and for substrate 121b, laser diodes LD1b-LD10b are connected and wired in a series as in the circuit diagram shown in FIG. 11 with, for example, the cathode terminal of laser diode LD1b connected to the anode terminal of laser diode LD2b. In this way, two sets of constant-current circuits are used in the present exemplary embodiment, but a configuration may be adopted in which all of the laser diodes are connected in a series and the emission state of laser light is controlled simultaneously.

In the present exemplary embodiment, because the orientation of the linearly polarized light of laser diodes LD1a-LD10a and laser diodes LD1b-LD10b is the same, the same component can be used as substrates 121a and 121b. The content of the laser light that is emitted from substrate 121a and substrate 121b is the same. The intensity of output light of the laser light source of the present exemplary embodiment is twice the intensity of the laser light emitted from substrate 121a or 121b. By using a plurality of identical laser light sources as in the present exemplary embodiment, the intensity of laser light of the same type can be made several times greater.

In a case in which light source device 1401 and projector 1400 shown in FIG. 15 are configured using the laser light source of the present exemplary embodiment and 3D display system is implemented using modulator 1404, the occurrence of uneven color and uneven luminance on the projection surface is prevented, and devices having excellent color uniformity and luminance uniformity are realized.

In the present exemplary embodiment, there are ten types of orientation of linearly polarized light for each color of laser light, and uneven color and uneven luminance on the projection surface are cancelled in practical use.

In addition, the disposition of each laser diode by which the angles are rotated in ten ways is not limited to the form shown in drawings, and a similar effect is obtained by disposition in any order.

Further, the number of laser diodes in one circuit is not limited to ten, and a similar effect is obtained regardless of the number adopted.

Third Exemplary Embodiment

Figure 13:
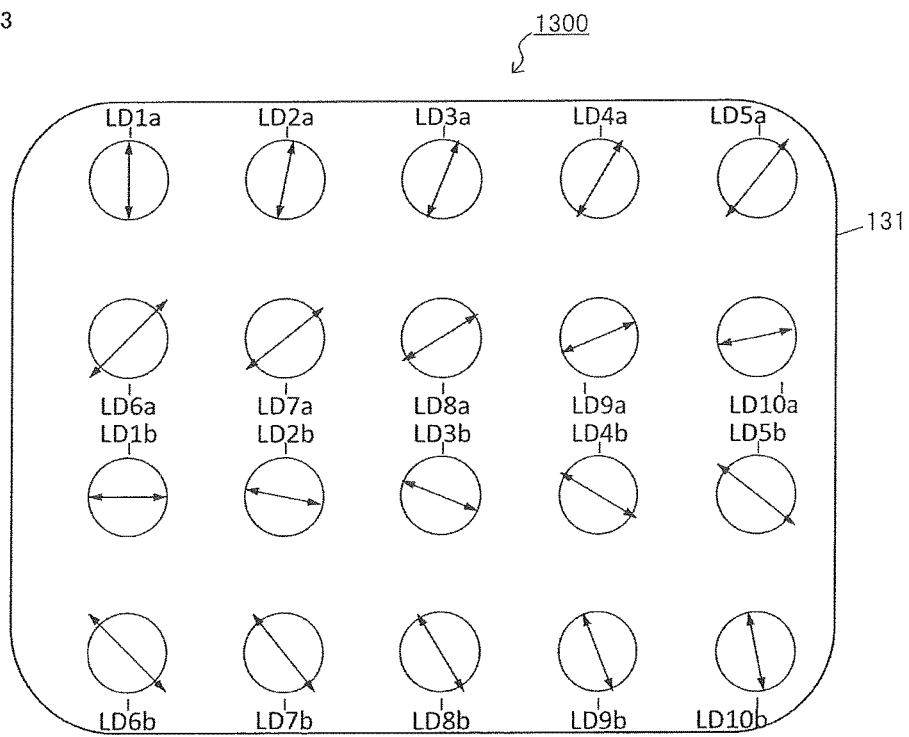
FIG. 13 is a plan view showing the principal constituent elements of the third exemplary embodiment of the laser light source according to the present invention.

FIG. 13 is a plan view showing the principal constituent elements of the third exemplary embodiment of the laser light source according to the present invention.

Twenty laser diodes LD1a-LD10a and LD1b-LD10b are arranged in matrix form on support part 131 that makes up laser light source 1300.

Each of laser diodes LD1a-LD10a and LD1b-LD10b has the outer appearance shown in FIG. 10, is provided with pin 101 that connects to an anode and pin 102 that connects to a cathode, and emits linearly polarized light of an orientation that accords with the lines that connect pin 101 and pin 102.

Laser diodes LD1a-LD10a and LD1b-LD10b in the present exemplary embodiment all supply light of a first wavelength (for example, blue light).

Each of laser diodes LD1a-LD10a and laser diodes LD1b-LD10b is disposed such that the orientation of the linearly polarized light of the laser light that is emitted differs for each.

If the orientation of the linearly polarized light that is supplied by laser diode LD1a is assumed to be 0 degrees, the orientation of the linearly polarized light of laser diode LD2a is assumed to be rotated by 180×1/20=9 degrees, the orientation of the linearly polarized light of laser diode LD3a is assumed to be rotated by 180×2/20=18 degrees, and the orientation of the linearly polarized light of laser diode LD10a is assumed to be rotated by 180×9/20=81 degrees.

Further, the orientation of the linearly polarized light of laser diode LD1b is assumed to be rotated by 180×10/20=90 degrees, the orientation of the linearly polarized light of laser diode LD2b is assumed to be rotated by 180×11/20=99 degrees, the orientation of the linearly polarized light of laser diode LD3b is assumed to be rotated by 180×12/20=108 degrees, and the orientation of the linearly polarized light of laser diode LD10b is assumed to be rotated by 180×19/20=171 degrees. In this way, the orientations are disposed to successively rotate by angles of 9 degrees.

Figure 14:
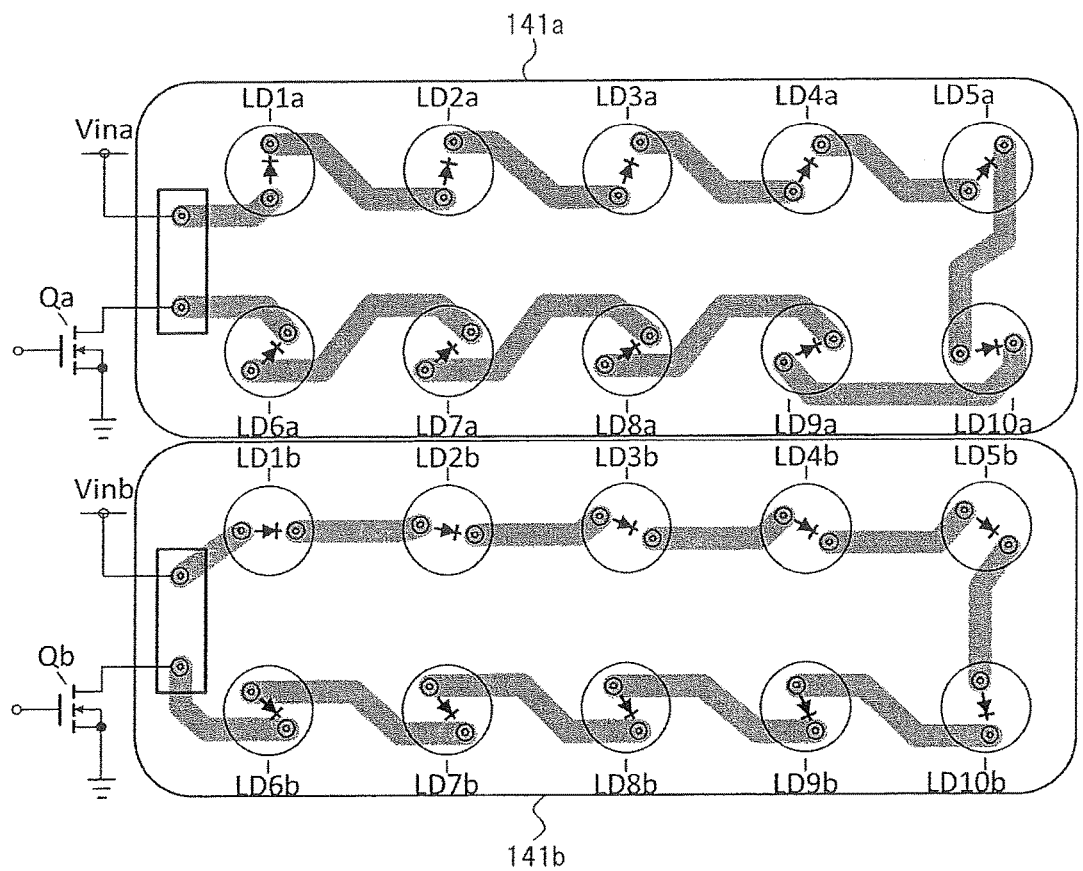
FIG. 14 shows the circuit pattern that is used in the third exemplary embodiment that realizes the circuit diagram shown in FIG. 11.

The circuit that drives laser diodes LD1a-LD10a and laser diodes LD1b-LD10b of the present exemplary embodiment is the same as the circuit shown in FIG. 11, and FIG. 14 shows the circuit pattern that is used in the present exemplary embodiment.

Laser diodes LD1a-LD10a are connected in a series, drive voltage Vina is applied to the anode, and the emission state of the laser light is controlled according to the ON/OFF state of switching transistor Qa that is connected to the anode. Laser diodes LD1b-LD10b are connected in a series, drive voltage Vinb is applied to the anode, and the emission state of the laser light is controlled according to the ON/OFF state of switching transistor Qb that is connected to the anode. In this way, two sets of constant-current circuits are used in the present exemplary embodiment as well, but a configuration may be adopted in which all of the laser diodes are connected in a series and the emission state of laser light is controlled simultaneously.

Substrates 141a and 141b shown in FIG. 14 are components realized by, for example, printed wiring boards or flexible boards. Substrate 141a and substrate 141b are mounted on support part 91, and laser diodes LD1a-LD10a and laser diodes 1b-LD10b are packaged. On substrate 141a, laser diodes LD1a-LD10a are connected and wired in a series as shown in the circuit diagram shown in FIG. 11 with, for example, the cathode terminal of laser diode LD1a connected to the anode terminal of laser diode LD2a, and on substrate 141b, laser diodes LD1b LD10b are connected and wired in a series as in the circuit diagram shown in FIG. 11 with, for example, the cathode terminal of laser diode LD1b connected to the anode terminal of laser diode LD2b.

When the laser light source of the present exemplary embodiment is used to form light source device 1401 and projector 1400 shown in FIG. 15 and modulator 1404 is used to implement a 3D display system, the occurrence of uneven color and uneven luminance on the projection surface is prevented and devices having excellent color uniformity and luminance uniformity are realized.

In the present exemplary embodiment, the laser light of each color has twenty variations of orientations of linearly polarized light, whereby, compared to the second exemplary embodiment, a further cancellation of uneven color and uneven luminance on the projection surface is obtained resulting in excellent color uniformity and luminance uniformity.

In addition, the disposition of each laser diode that is rotated in angles of twenty variations is not limited to the form shown in the figures, and similar effects are obtained by disposition in any order.

Further, the number of laser diodes in one circuit is not limited to twenty, and similar effects are obtained regardless of the number.

Finally, in any of the above-described exemplary embodiments, for the plurality of laser diodes that are mounted on a substrate, the orientations of the emitted linearly polarized light are assumed to be any equal-distance angle that makes up an arithmetical progression in a range from 0 to less than 180 degrees. Better color uniformity and luminance uniformity can be obtained than when not adopting this type of configuration, for example, in a case in which the range is narrow or a case in which the orientation varies at angles that are not of equal difference.

EXPLANATION OF REFERENCE NUMBERS 71, 121a, 121b, 141a, 141b substrate
700 laser light source
1400 projector
1401 light source device 1402 image forming unit
1403 projection optical system
1404 modulator
laser diodes LD1, LD2, LD3, . . . LDn laser diodes

What is claimed is:

1. A laser light source comprising:
a plurality of laser diodes that are mounted on a substrate and that emit linearly polarized light; wherein:
said plurality of laser diodes are each provided with a first pin and a second pin and emit linearly polarized light of an orientation that accords with lines that connect the first pin and the second pin; and
said plurality of laser diodes are arranged such that an orientation of linearly polarized light that is emitted differs for said plurality of laser diodes.

2. The laser light source as set forth in claim 1, wherein:
said plurality of laser diodes are arranged in matrix form on said substrate.

3. The laser light source as set forth in claim 1, wherein:
the orientations of emitted linearly polarized light among the plurality of laser diodes are any one of equal-difference angles that make up an arithmetical progression within a range of from 0 to less than 180 degrees.

4. The laser light source as set forth in claim 1, wherein:
the orientation of emitted linearly polarized light of each of the plurality of laser diodes is any one of 180×i/n degrees (where i=0, 1, 2, . . . , n−1).

5. The laser light source as set forth in claim 1, wherein:
a plurality of said substrates are provided.

6. The laser light source as set forth in claim 5, wherein:
on said plurality of substrates, the plurality of laser diodes that are mounted are similarly arranged.

7. The laser light source as set forth in claim 5, wherein:
on said plurality of substrates, the plurality of mounted laser diodes are each arranged differently.

8. A projector comprising:
a light source device that is realized using the laser light source as set forth in claim 1 and that supplies light that contains the emitted light of said plurality of laser diodes;
an image-forming unit that uses the light from said light source device to form image light; and
a projection optical system that projects image light that was formed in said image forming unit.

9. The projector as set forth in claim 8, further comprising:
a modulator that transmits light outputted from said projection optical system, wherein said modulator controls the orientation of linearly polarized light that is transmitted.

10. The projector as set forth in claim 9, wherein:
said image-forming unit switches and generates right-eye image light and left-eye image light in a time series.

11. The projector as set forth in claim 9, wherein:
said modulator transmits linearly polarized light of respectively different orientations when transmitting right-eye image light and left-eye image light.

12. The projector as set forth in claim 9, wherein:
the light transmitted through said modulator is uniform regardless of a site on a projection surface.

13. The projector as set forth in claim 8, wherein:
said image-forming unit switches and generates right-eye image light and left-eye image light in a time series.

14. The projector as set forth in claim 8, wherein:
said image-forming unit switches and generates right-eye image light and left-eye image light.

15. The projector as set forth in claim 8, wherein:
the orientations of emitted linearly polarized light among the plurality of laser diodes are any one of equal-difference angles that make up an arithmetical progression within a range of from 0 to less than 180 degrees.

16. A laser light source manufacturing method comprising:
arranging a plurality of laser diodes that emit linearly polarized light on a substrate such that an orientation of emitted linearly polarized light differs for said plurality of laser diodes, wherein
said plurality of laser diodes are each provided with a first pin and a second pin and emit linearly polarized light of an orientation that accords with lines that connect the first pin and the second pin.

17. The laser light source manufacturing method according to claim 16, further comprising arranging said plurality of laser diodes in matrix form on said substrate.

18. The laser light source manufacturing method according to claim 16, wherein:
the orientations of emitted linearly polarized light among the plurality of laser diodes are any one of equal-difference angles that make up an arithmetical progression within a range of from 0 to less than 180 degrees.

19. The laser light source manufacturing method according to claim 16, wherein:
the orientation of emitted linearly polarized light of each of the plurality of laser diodes is any one of 180×i/n degrees (where i=0, 1, 2, . . . , n−1).

20. The laser light source manufacturing method according to claim 16, further comprising providing a plurality of said substrates.

* * * * *